United States Patent [19]

Kovacs et al.

[11] Patent Number: 5,268,533
[45] Date of Patent: Dec. 7, 1993

[54] PRE-STRESSED LAMINATED LID FOR ELECTRONIC CIRCUIT PACKAGE

[75] Inventors: Alan L. Kovacs, Long Beach; Gary W. Johnson, Irvine; William A. Vitriol, Anaheim; Clifford L. Shock, Jr., San Luis Obispo, all of Calif.

[73] Assignee: Hughes Aircraft Company, Los Angeles, Calif.

[21] Appl. No.: 695,447

[22] Filed: May 3, 1991

[51] Int. Cl.⁵ ............................................. H01L 23/02
[52] U.S. Cl. .................................... 174/52.4; 257/704
[58] Field of Search ................. 174/52.1, 52.2, 52.3, 174/52.4; 361/380, 390; 257/678, 704

[56] References Cited

U.S. PATENT DOCUMENTS

| | | | |
|---|---|---|---|
| 3,405,441 | 10/1968 | Asher et al. | 174/52.4 |
| 3,504,096 | 3/1970 | Nagel | 174/52.4 |
| 3,538,597 | 11/1970 | Leinkram et al. | 174/52.4 |
| 3,700,788 | 10/1972 | Spurck | 174/52.4 |
| 3,848,077 | 11/1974 | Whitman | 174/52.4 |
| 4,326,095 | 4/1982 | Yamaguchi | 174/52.4 |
| 4,577,056 | 3/1986 | Butt | 174/52.4 |
| 4,717,948 | 1/1988 | Sakai et al. | 357/74 |
| 4,873,615 | 10/1989 | Grabbe | 174/52.4 |

Primary Examiner—Leo P. Picard
Assistant Examiner—Bot Ledynh
Attorney, Agent, or Firm—Elizabeth E. Leitereg; Terje Gudmestad; W. K. Denson-Low

[57] ABSTRACT

A lid (2) for an electronic circuit housing (4) has inner (24) and outer (22) laminated layers that are formed from two different materials, joined to each other and bowed outward from the housing (4) so that the inner layer (24) is under tensile bending stress at the interface between the layers, and the outer layer (22) is under compressive bending stress at the interface. This forms a pre-stress on the lid that resists external loads, and causes the lid to deflect under loading in a linear, predictable and recoverable fashion. The lid is preferably formed by thermal bonding of two materials having different coefficients of thermal expansion, with the bow forming as the materials cool. In one example two different metals are used, and in another a metal is bonded to a glass-ceramic tape.

24 Claims, 2 Drawing Sheets

PRE-STRESSED LAMINATED LID FOR ELECTRONIC CIRCUIT PACKAGE

BACKGROUND OF THE INVENTION

1. Field of the Invention

This invention relates to high strength lids for electronic circuit packages that avoid interference with circuit components within the package when a mechanical load is applied to the lid.

2. Description of the Related Art

Microelectronic circuits incorporating silicon or ceramic substrates often enclosed within a hermetically sealed package or housing that provides support and protection for the circuit. A number of electronic components and interconnecting metallizations are formed on a microcircuit board that is mounted to the base of the housing. The packages are hermetically sealed by a cover or lid over the sidewalls that surround the circuitry. The material most commonly used for both the housings and lids is Kovar ® alloy manufactured by the General Electric Company, with a composition of 53% iron, 29% nickel and 18% cobalt; an optional gold or nickel plating may be added to prevent corrosion. The lids are welded or soldered to the upper surface of the package sidewalls, thereby hermetically sealing the packages.

Conventional lids are typically formed as simple flat plates, or in "hat-shaped" configurations in which the lid is elevated above the upper edges of the package sidewalls. Such walls and sealing methods are discussed in J. Holley, "Solder Sealing of Large Complex Hybrid microcircuits", *ISHM National Symposium Proceedings* (1969), pages 5-11. The lid must be able to withstand substantial loadings. Heavy loadings are encountered particularly prior to shipment, when the assembled circuit packages are tested to confirm the hermeticity of the seal. During this test the package is subjected to a significant pressure that can cause the lid to deflect downward toward the interior circuitry which it is designed to protect. If the downward deflection is excessive it can cause shorting and/or damage to the electrical components, and can also induce an excess stress in the weld seals that results in seal failure.

One way to strengthen the lid is to simply make it thicker. However, this increases both the package weight and its overall size. Another approach is to increase the height of the package sidewalls to maintain the necessary clearance above the electrical components and circuit traces under maximum lid depression. However, this adds undesirable volume to the package in excess of what is needed for the actual circuitry, and may violate height restrictions. For large packages, it has been necessary to provide posts inside the package to internally support the lid. While the posts provide sufficient strength, they reduce the amount of substrate area available for circuitry and, since circuit traces cannot be routed in the areas occupied by the posts, they increase both the difficulty of routing and the number of required routing layers. When the substrate is silicon, an even greater concern is that holes are typically drilled through the substrate to allow the post to contact the package base. This introduces the danger of cracking the fragile substrate, and therefore has a negative impact upon reliability.

An improved strengthened lid is disclosed in a pending patent application entitled "Domed Lid for Integrated Circuit Package", Ser. No. 465,851 filed Jan. 16, 1990 by Kovacs et al., and assigned to Hughes Aircraft Company, the assignee of the present invention. In this application the lid has a dome shape which adds to its ability to withstand external loads. However, the dome portion extends below the upper edge of the package's sidewalls, and reaches a minimum clearance above the base in the vicinity of the sidewalls. This can interfere with wire bonding near the wall and effectively reduces the amount of area available in this region.

For all of the above techniques in which the lid deforms under a load, the initial elastic deformation under relatively lighter loads occurs in a linear predictable fashion, and the lid recovers its original shape when the load is removed. However, for loads that go beyond this initial linear deformation region, the lid enters a plastic regime in which its deformation increases but at an unpredictable rate. If the load is removed after entering this regime, the lid will not recover its original shape; if the load is not removed in time it can stretch progressively to failure.

SUMMARY OF THE INVENTION

The present invention seeks to provide a new type of lid for an electronic circuit package that has a greater strength than previous lids, does not incur either weight penalties or loss of area available for the circuitry, and deforms in a linear, predictable and recoverable fashion through a significantly greater range of loads.

The new lid is formed from a lamination of two different materials that are bowed outward away from the circuit package, preferably due to mismatched coefficients of thermal expansion (CTE). This places the inner layer under a tensile bending stress and the outer layer under a compressive bending stress, at the juncture of the two layers, that resists loads applied to the outer layer. One of the layers is preferably metallic, such as an iron-nickel alloy. The other layer is a secondary metal member selected for CTE mismatch, or a ceramic. The ceramic is obtained as a mixture of glass and/or ceramic, either as discrete components or as presintered particles that are transformed through the application of heat into a sintered ceramic body. It can be formed from pure ceramic tape, glass-ceramic tape, crystallizable glass tape in which the glass is converted to ceramic by devitrification, or by thick film screen printing. With a ceramic inner layer, additional electronic circuitry can be provided on the inside of the lid for purposes such as monitoring the interior environment of the package or the mechanical stresses on the lid.

The invention also includes preferred methods of fabricating the lid. For a bimetallic lid, the lid is formed from laminated layers of materials that have different CTEs. They are laminated together at an elevated temperature, and then allowed to cool and shrink so that they assume the desired bowed shape. The material having the greater CTE during cooling is on the inside of the bow and in tensile bending stress at the interface of the two layers, while the material having the lesser CTE during cooling is on the outside and in compressive bending stress at the interface.

When a ceramic is used for one of the laminates and a FeNi alloy such as Kovar for the other laminate, the alloy's CTE is non-constant and its degree of deformation crosses over that of the ceramic at an elevated temperature. Depending upon whether the ceramic becomes rigid during cooling at a temperature above or below the crossover temperature, either the ceramic layer or the metallic layer can be placed on the outside of the bow. If the ceramic layer is on the outside but it is desired to have a ceramic layer facing the interior of the housing so that it can support additional electric circuitry, a thicker layer of ceramic can be placed on the opposite side of the metal so that it conforms to the outside of the bow, with the thinner ceramic layer left on the inside.

These and other features and advantages of the invention will be apparent to those skilled in the art from the following detailed description, taken together with the accompanying drawings, in which:

DETAILED DESCRIPTION OF THE INVENTION

Figure 1:
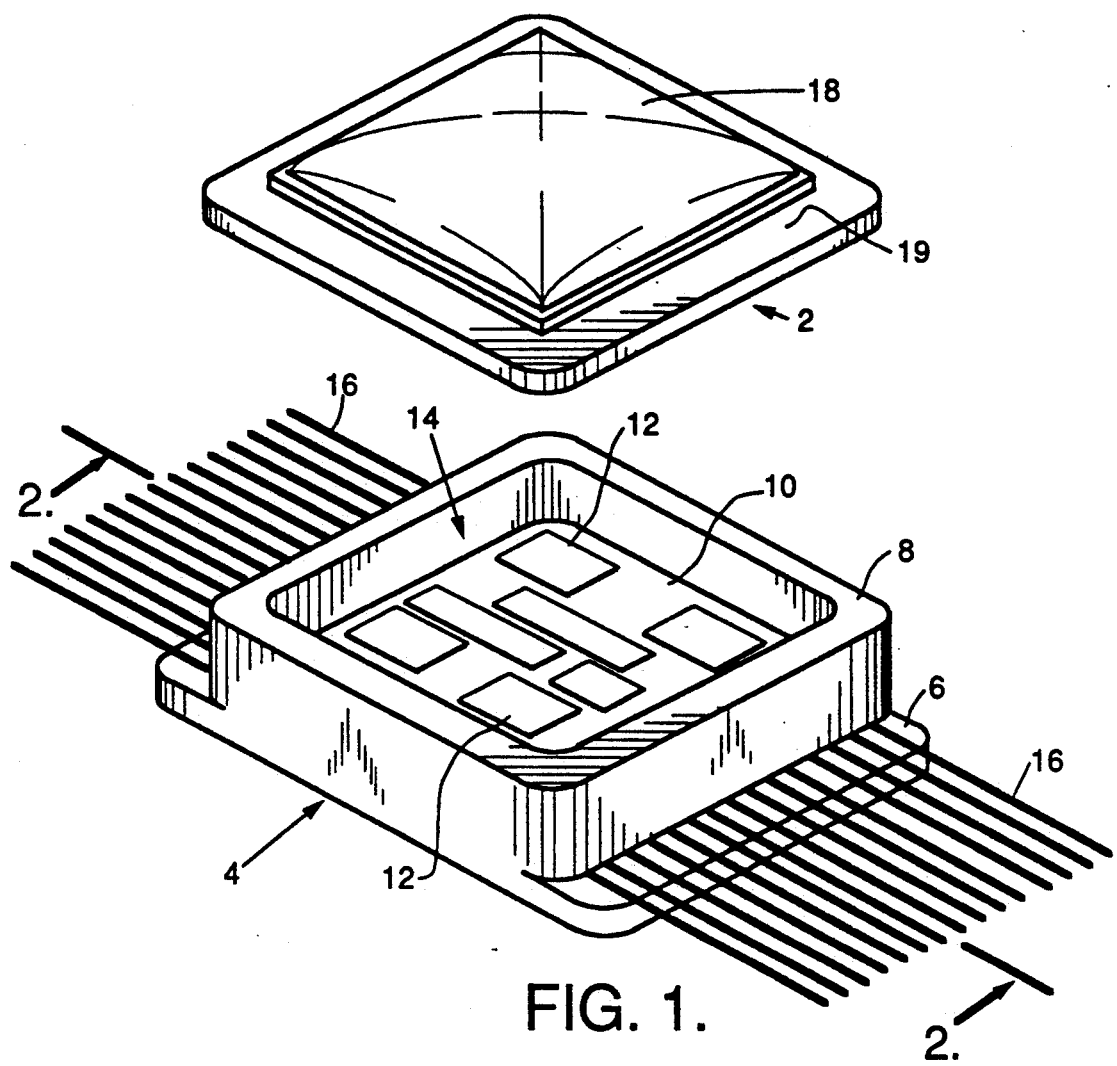
FIG. 1 is an exploded perspective view of an electronic circuit package and lid formed in accordance with the invention.

A microcircuit assembly is shown in FIG. 1 that includes a lid 2 formed in accordance with the invention. The assembly is illustrated as a "flatpack" package 4 with a generally rectangular base 6 and upstanding peripheral sidewalls 8. The invention is not limited to a flatpack configuration, and is applicable in general to any type of circuit package requiring a lid. The package may be flat, with the sidewalls provided on the lid. A hybrid microcircuit board 10, upon which various integrated circuit components and passive devices 12 are mounted, is attached to the base 6 within a cavity 14 defined by the sidewalls 8. A network of leads 16 extends through the sidewalls 8 into the cavity 14 for connection to the circuit board 10.

Figure 2:
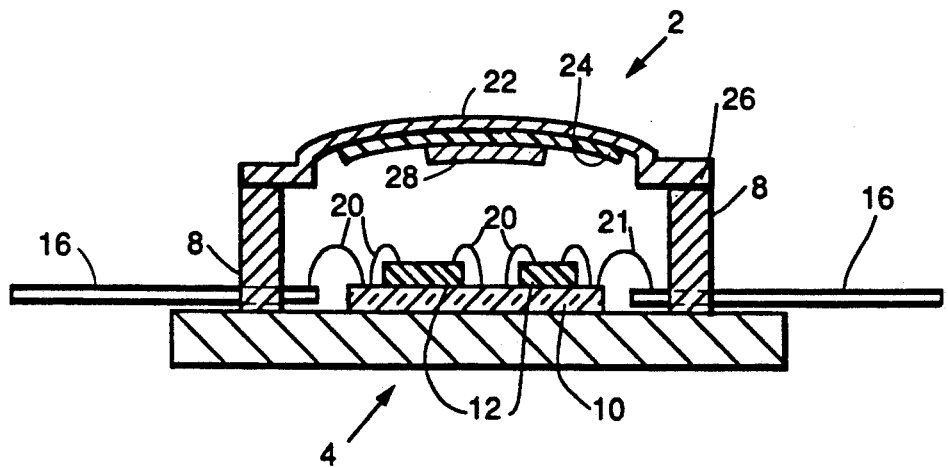
FIG. 2 is a sectional view taken along line 2—2 of FIG. 1 with the lid in place on the circuit package.

The lid 2 has a pre-stressed central portion 18 and a peripheral lip 19 that extends around the central portion and fits over the flatpack's sidewalls, to which it is seam welded. A sectional view of the circuit package with the lid in place hermetically sealing the interior of the package is shown in FIG. 2. Wire bonds 20 connect the hybrid circuit components 12 to a metallization pattern (not shown) on circuit board 10, while additional wire bonds 21 connect the circuit board metallization to lead wires 16.

The lid 2 is provided as a pre-stressed lamination formed from layers of two different materials having different CTEs. The outer layer 22 extends beyond the inner layer 24, and includes the peripheral lip that is attached to the remainder of the package. A nickel-based material is preferred for the outer layer 22, since nickel can be brazed, soldered or welded to a Kovar or Mo seal ring on the upper wall of the circuit housing; a weld 26 is illustrated in FIG. 2.

A pre-stress is established in the lid during its fabrication such that the lid is slightly bowed outward, with the inner layer 24 under tensile bending stress and the outer layer 22 under compressive bending stress at the interface of the two layers. The actual amount of bow is considerably exaggerated in FIG. 2 for purposes of illustration; in practice a bow of only about 0.01–0.03 inch over a 4 inch diameter will significantly increase the lid's resistance to externally applied loads. Furthermore, the amount of lid deflection under load has been found to be quite linear, predictable and recoverable, as opposed to the plastic deformation regime encountered with prior lids. This considerably increases the reliability of the lid when designed to withstand a specific load.

Figure 3:
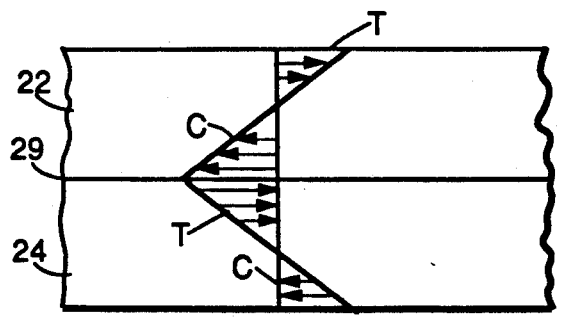
FIG. 3 is a stress diagram taken along a vertical cross-section of the lid.

FIG. 3 is an illustrative stress diagram of a section of the lid 2 shown in FIG. 2. Although the bow is not shown for simplicity, it is assumed that the upper lid layer 22 is on the outside of the bow and the lower lid layer 24 on the inside. Under these conditions, the outer layer 22 is under compressive bending stress at the interface 29 between the two layers, while the inner layer 24 is under tensile bending stress at the interface. This balanced stress condition has been found to significantly increase the lid's resistance to external loading, and to make the lid deformation that does occur more linear and predictable than with prior lids.

In principle, many different materials may be used for the lid lamination layers, so long as the two layers can be bonded together so as to inhibit any relative sideways slippage between the two, and the required pre-stressed bowed shape can be established. A preferred method is to use two materials with dissimilar CTEs, bond them together at an elevated temperature, and then cool the lamination to establish the bow as the layers contract at differing rates during cooling.

The selection of materials to be used for the stressed and stressing layers can be made to provide a mismatch CTE that corresponds to the specific package requirements, depending upon the area of the lid that must be supported. A pre-stressed lid according to the invention can be larger than prior lids, without the need for internal support posts. This results in a more efficient use of the substrate area, and also avoids the problem of substrate breakage associated with support posts. With a metal outer layer, the lid can be seam-sealed to the housing using conventional processes, while providing electromagnetic shielding. With the bowed dome portion 18 of the lid extending above the peripheral sealing lip 20, additional area is also provided around the periphery of the circuit board 10 inside the package to allow for wire bonding.

The two layers could be formed from two metals with different CTEs, or one layer could be metal and the other a ceramic. Details of a metal-ceramic lid will first be given, followed by a discussion of a bimetallic lid.

Metal-Ceramic Lid

A dielectric layer can theoretically be obtained from pure glass, pure ceramic, or glass-ceramic mixtures, either as discrete components or as presintered particles that are transformed when heated into a sintered ceramic body. However, pure glass will generally not have sufficient mechanical strength for purposes of the invention, while crystalline ceramic requires too high a temperature to fire (on the order of 1,000°–1,200° C.). A glass-ceramic mixture is normally preferred, with the glass lowering the mixture's firing temperature. The ceramic can be applied to the metal layer either as a tape, or by standard thick film screen printing. Several layers of thick film would be required to equal the thickness of one tape layer, but a correspondingly finer thickness resolution is attainable with thick film techniques. The ceramic layer can also be formed by dipping or spin coating, but a low viscosity would be required with a build-up of many more individual layers than with thick film printing. Furthermore, neither dipping nor spin coating allow for selective positioning of the ceramic, and would require additional masking and removal steps to limit the ceramic to the desired area.

A ceramic layer can also be obtained from devitrifying glass, which is a specialized form of glass below its recrystallization temperature. Above its recrystallization temperature it acts like an epoxy, crystallizing out ceramic particles to become a rigid glass-ceramic with significant mechanical strength. The material does not become wholly crystalline, but rather forms ceramic crystals in a matrix of glass that bonds to the metal layer. The recrystallization temperature is typically about 450°-850° C., depending upon the particular material. It would typically be heated to about 20°-50° C. above its recrystallization temperature during fabrication of the lid; higher temperatures would require a longer fabrication period.

In a preferred embodiment, a low temperature ceramic tape is used for the inner layer 24, and bonded to a metal outer layer 22. The metal layer could be Kovar, Invar (an Ni/Fe alloy with a different component ratio than Kovar), pure nickel, another material with a nickel coating, or another type of metal if an ability to weld, braze or solder to a Kovar or Mo seal ring on the housing is not a concern.

A ceramic tape is a dielectric mixture of glass and ceramic, typically $Al_2O_3$ with plasticizers added. A preferred formulation is Ditran ® ceramic tape by Electro Materials Corporation of America, a mixture of lead borosilicate glass and $Al_2O_3$, but other glass-ceramic tapes could also be used. The tape thickness for purposes of the invention is typically in the range of about 0.002–0.010 inch.

The use of glass-ceramic tape in a multilayer circuit board fabrication technology is disclosed in U.S. Pat. No. 4,645,552, issued Feb. 24, 1987, entitled "Process for Fabricating Dimensionally Stable Interconnect Boards", to William Vitriol et al. In this process, which may be described as a "transfer-tape" method, glass-ceramic tape layers are transferred to and fired on the surface of a generally rigid, conductive substrate, or an insulative substrate upon which a conductive circuit pattern has been formed. The tape layers provide electrical isolation between the substrate and electrical conductors or electronic components that are subsequently bonded to or mounted on the top surface of the glass-ceramic tape layers. Electrical interconnections are made between layers by vias through the tape prior to firing the first tape layer. The next conductor layer in this vertical interconnect process is then screen printed on the first tape dielectric and itself fired. This process is repeated until the hybrid circuit is built up to a desired vertical, multilayer interconnect level. As an alternative process to individually firing conductor and dielectric layers, the complete structure or portions thereof can be simultaneously fired as disclosed in the above referenced patent to Vitriol.

When a glass-ceramic is used as the inner lamination layer, additional circuitry 28 can be screen printed on the exposed surface of the tape inside the housing. Such circuitry can include devices used to monitor the inner package environment, such as humidity or ammonia sensors. The circuitry can also include piezoelectric sensors to monitor stresses applied to the lid. Electrical access to the circuitry on the lid can be established through a small hole formed in the metal portion of the cover before lamination, or by soldering lead wires from the circuitry to the circuit board within the package prior to sealing the lid.

Figure 4:
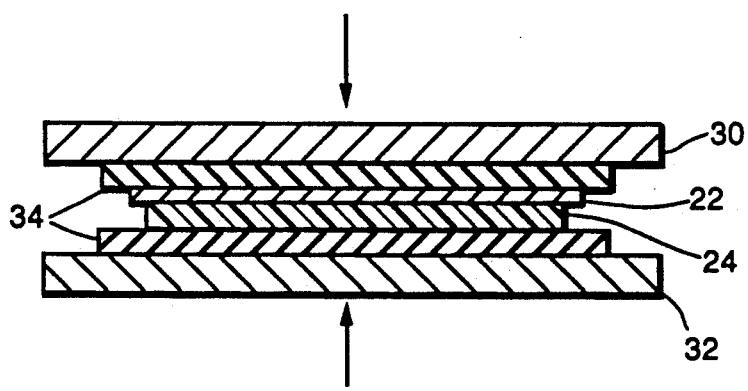
FIG. 4 is a sectional view of a lamination step used in forming the lid.

An initial step in forming a ceramic-metal lamination is illustrated in FIG. 4. The outer metal layer 22 and inner ceramic tape layer 24 are pressed together between two plates 30, 32, with layers of inert material 34 inserted between the plates and the lamination materials to prevent bonding therebetween. The plates 30, 32 are initially heated to about 60°-70°C., and apply a compressive pressure to the lamination of about 3,000 psi. These conditions cause the organic in the tape 24 to stick to the metal layer 22, establishing an initial bond between the two. In the event that circuitry 28 is required, it can be screen printed onto the tape either before or after this lamination, and additional ceramic layers may be added if desired.

The laminate is then run through a furnace that is typically heated to 800°-950° C., depending upon the particular materials used. A conventional thick film belt drive furnace may be employed. The temperature rise within the furnace would typically be about 50° C. per minute, with the laminate held at maximum temperature for about 12 minutes and then cooled at about 50° C. per minute. During the heating stage the organic portion of the ceramic pyrolizes (burns off) generally at about 200°-300° C. Above about 500° C. the glass in the glass-ceramic mixture begins to soften and coat the $Al_2O_3$ particles, and to wet and mechanically flow into the rough surface of the Kovar layer 22. At the elevated furnace temperature the tape forms both a mechanical and chemical bond with the metal layer that inhibits relative sideways slippage between the two layers during subsequent cooling, even though their CTEs differ. During the initial cooling phase the ceramic-glass is still fluid enough for it to conform to the shrinking size of the metal layer. However, the glass-ceramic becomes progressively more viscous as cooling continues, and eventually a point is reached at which the tape resists further contraction with the metal layer and contracts at its own rate. Beyond this point the composite begins to bow as cooling progresses.

Figure 5:
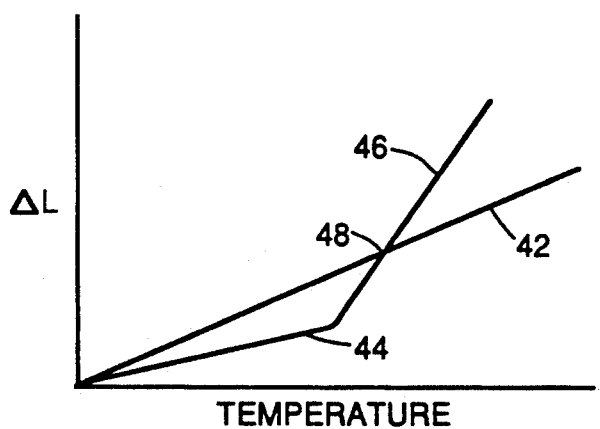
FIG. 5 is a representative graph of the thermal expansion of the tape and FeNi layers preferred for the lid, as a function of temperature.

Whether the ceramic or the metal will be on the outside of the bowed lamination depends upon the relative CTEs of the two materials; whichever has the greater CTE during cooling after the ceramic-glass has become rigid enough to induce bending of the lamination will be on the inside. This is a function of the particular materials used, as illustrated in FIG. 5, which plots the change in length of unrestrained ceramic tape and Kovar alloy against temperature.

The ceramic will follow a generally linear length-temperature plot 42, typically about 6-7 ppm/°C. Kovar or other FeNi alloys, by contrast, will initially exhibit a relatively low CTE, with a length differential of about 4 ppm/°C. along curve segment 44, followed by a higher CTE and a corresponding length differential on the order of about 14 ppm/° C. along curve segment 46. The change in CTE reflects a transition from domination by Ni to domination by Fe. The transition temperature is known as the "Curie point", and typically occurs at about 400° C.

Figure 6A:
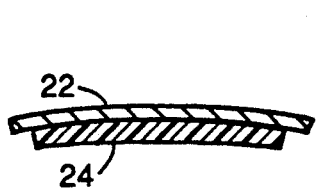
FIGS. 6a and 6b are cross-sections of lids with a metal layer and with a glass-ceramic layer on the outside of the bow, respectively.
Figure 6B:
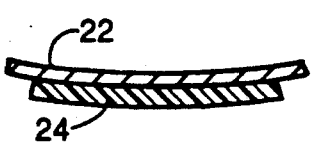

A crossover 48 occurs between the ceramic curve 42 and the Kovar curve 46 above the Curie point. Whether the tape or the metal will be on the outside of the bow depends upon whether the tape becomes rigid and resists conforming to the contraction of the metal at a temperature above or below the crossover. If the tape is still fluid enough to conform to the contraction of the metal at the crossover point and does not become rigid enough to produce a bow in the lamination until a lower temperature is reached, the metal 22 will be on the outside and the tape 24 will be on the inside of the bow, as indicated in FIG. 6a. If, however, the tape becomes rigid and no longer conforms to the shrinkage of the metal at a temperature above crossover point 48, the metal 22 will be on the inside and the tape 24 will be on the outside of the bow as indicated in FIG. 6b.

Figure 7:
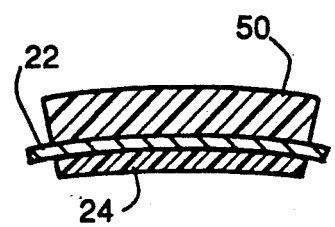
FIG. 7 is a sectional view of a triple laminate lid.

If the tape becomes rigid above the crossover point but it is desired to have tape on the inside of the bow so that monitoring circuitry 28 may be provided, a modification such as that shown in FIG. 7 may be used. In this case a second layer of tape 50 is adhered to the opposite side of metal layer 22 from the first tape layer 24. The second tape layer 50 is thicker than tape 24, such as by using a double layer, and therefore dominates layer 24 during cooling so that layer 50 is on the outside of the bow. This leaves the thinner tape layer 24 on the inside, where it can be used as a base for the desired circuitry. Tape layers on both sides of the metal could also be used when the number of tape layers required on one side to support the internal circuitry 28 is greater than the number of layers desired for mechanical stress purposes. In this event one or more mechanically compensating ceramic layers can be formed on the opposite side of the metal.

Because of the relatively high furnace temperatures employed in the bond process, care must be exercised to avoid oxidation of the metal lid components. Accordingly, the fabrication process should be conducted in a reducing or inert atmosphere, such as a hydrogen-nitrogen (forming gas), nitrogen, or a vacuum.

Metal—Metal Lid

As mentioned above, the invention is also applicable to metal-metal laminates and laminates of other materials that can be bonded together and have significantly different CTEs. Diffusion bonding as illustrated in FIG. 4 is the preferred method for joining the two layers. For a metal-metal bond, the inert layers 34 are preferably fine lapped alumina ceramic or boron nitride ceramic, lapped to a surface finish of about 2 microinches. Bonding takes place at a temperature of about 1,000° C. and a pressure of about 3,000 psi, in a vacuum. A high strength braze alloy might also be used for the joinder. Soldering is generally inadequate, since a solder joint eventually tends to stretch (creep), which would dissipate the required pre-stressing.

By diffusion bonding materials with a sufficient CTE mismatch, a stress equal and opposite to in-service environmental loads can be created in the outer layer of the lid. This stress acts as a spring-load which resists inward deflection of the lid. The selection of particular materials is based upon the size and maximum package height allowed by a particular application. With Kovar or another FeNi based alloy as the stressed component, the stressing layer can be provided from any material which has a large CTE mismatch to the alloy and is diffusion bondable thereto. Diffusion bonding of non-nickel based alloys, ferrous metals and non-ferrous metals can be accomplished by nickel-plating the material before the bonding operation, so long as the material selected can withstand the bonding temperatures and will not yield under the thermally induced stresses caused by the bonding.

In a demonstration of the invention, 0.020 inch thick layers of Kovar and Invar were used, with the Kovar layer forming the stressed member and the Invar layer the stressing member. The two layers were diffusion bonded together at a temperature of about 1,000° C. at a pressure of 3,000 psi for 45 minutes. The bonding pressure was relieved as soon as the power to the vacuum furnace was turned off to prevent bonding to the platens; the lid cooled to ambient temperature in about two hours. The outside lid dimensions were 2×4 inches; the lid was able to support 30 psig with only a 0.015 inch deflection. By contrast, a standard 0.040 inch thick lid deflected nearly 0.030 inch under the same pressure load.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A lid for an electronic circuit housing, comprising: inner and outer laminated layers shaped as a lid for an electronic circuit housing, said layers being formed from two different materials, joined to each other to inhibit relative sideways slippage between the layers, and bowed outward with respect to said housing so that at their juncture the inner layer is under tensile bending stress and the outer layer is under compressive bending stress, the stresses on said layers resisting loads applied to said outer layer.

2. The lid of claim 1, said two materials having different coefficients of thermal expansion.

3. The lid of claim 2, wherein one of said materials is metallic and the other material is a ceramic.

4. The lid of claim 3, wherein said other material is a glass-ceramic tape, a glass-ceramic thick film or a devitrified glass.

5. The lid of claim 3, wherein said inner layer is a ceramic and said outer layer is metallic.

6. The lid of claim 5, further comprising a third layer joined to the outer surface of said metallic layer, said third layer being formed from said ceramic to a greater thickness than said inner layer.

7. The lid of claim 3, wherein said inner layer is metallic and said outer layer is a ceramic.

8. The lid of claim 2, one of said materials comprising an iron-nickel alloy.

9. The lid of claim 2, wherein said first and second materials are both metallic.

10. The lid of claim 2, wherein said layers are diffusion bonded to each other.

11. The lid of claim 2, wherein said layers are brazed together.

12. A package for an electronic circuit, comprising:
a housing for an electronic circuit,
a domed lid covering said housing, said lid comprising a first layer of a first material having an outwardly bowed shape relative to the interior of said housing, and a second layer of a second material that is joined to said first layer and resists inward bending of said first layer.

13. The electronic circuit package of claim 12, wherein one of said materials is metallic and the other material is a ceramic.

14. The electronic circuit package of claim 13, wherein said other material is a glass-ceramic tape, a glass-ceramic thick film or a devitrified glass.

15. The electronic circuit package of claim 13, wherein said ceramic layer is on the inner portion of said lid, relative to said housing.

16. The electronic circuit package of claim 15, further comprising electronic circuitry formed on said ceramic layer facing the interior of said housing.

17. The electronic circuit package of claim 16, wherein said circuitry on the ceramic layer includes means for monitoring the interior environment of said package.

18. The electronic circuit package of claim 16, wherein said circuitry on the ceramic layer includes means for monitoring mechanical stresses on said lid.

19. The electronic circuit package of claim 15, further comprising a third layer joined to the outer surface of said metallic layer, said third layer being formed from said ceramic to a greater thickness than said inner layer.

20. The electronic circuit package of claim 12, wherein said inner layer is metallic and said outer layer is a ceramic.

21. The electronic circuit package of claim 12, the upper portion of said housing including a peripheral sealing member, said lid being sealed to said sealing member with its dome extending above said sealing member.

22. The electronic circuit package of claim 21, said lid including a peripheral lip formed from one of said layers and sealed to the sealing member on said housing, the other of said lid layers being disposed on said domed portion inward from said lip.

23. The electronic circuit package of claim 22, wherein said sealing member and said lip both being nickel coated.

24. The electronic circuit package of claim 12, wherein said first and second materials are both metallic.

* * * * *